United States Patent [19]

Anstrom et al.

[11] Patent Number: 5,092,510
[45] Date of Patent: Mar. 3, 1992

[54] METHOD AND APPARATUS FOR CIRCUIT BOARD SUPPORT DURING COMPONENT MOUNTING

[75] Inventors: Joel R. Anstrom; Robert D. Hrehor, Jr., both of Austin; Robert A. Holloway; David P. Watson, both of Round Rock, all of Tex.

[73] Assignee: International Business Machines Corporation, Armonk, N.Y.

[21] Appl. No.: 616,152

[22] Filed: Nov. 20, 1990

[51] Int. Cl.⁵ .......................................... B23K 37/00
[52] U.S. Cl. .................................... 228/55; 228/106; 269/22
[58] Field of Search ...................... 228/5.5, 6.2, 106; 269/22

[56] References Cited

U.S. PATENT DOCUMENTS

| | | | |
|---|---|---|---|
| 3,627,190 | 12/1971 | Ramsey | 228/5.5 |
| 3,670,396 | 6/1972 | Lindberg | 228/106 |
| 3,699,640 | 10/1972 | Cranston | 228/106 |
| 4,013,209 | 3/1977 | Angelucci | 228/6.2 X |
| 4,017,793 | 4/1977 | Haines | 269/22 X |
| 4,607,779 | 8/1986 | Burns | 228/106 |
| 4,638,937 | 1/1987 | Belanger | 228/5.5 |
| 4,731,151 | 3/1988 | Kaller | 269/22 X |
| 4,733,813 | 3/1988 | Le Meau | 228/6.2 |

OTHER PUBLICATIONS

Sebonia, *Stress Compensating Future for Lead Bonder*, Western Electric Tech. Dig. No. 52, Oct. 1978, pp. 21-22.

*Primary Examiner*—Richard K. Seidel
*Assistant Examiner*—Patty E. Hong
*Attorney, Agent, or Firm*—Andrew J. Dillon

[57] ABSTRACT

The method and apparatus of the present invention may be utilized to support a selected mounting point on a circuit board during the mounting an electronic component. An integrated circuit device is selected and positioned adjacent a first side of a circuit board at a desired mounting point utilizing a robotic manipulator and a placement head. A support fixture is then urged into temporary contact with a second side of the circuit board utilizing a flexible mounting system such that minor variations or misalignments between the plane of the support fixture, the circuit board and the placement head are eliminated. In one embodiment of the present invention a flexible fluid filled bag is utilized in conjunction with the support fixture so that the presence of components on the second side of the circuit board may be accommodated while supporting the circuit board during component mounting. Finally, the requirement for providing a robotic manipulator and placement head capable of generating the substantial downward forces necesary to create a bond between a circuit board and an electronic component is eliminated by positioning the placement head and heated bonding tool proximate to the conductive leads of an electronic component and then forcefully urging the support fixture upward toward the heated bonding tool while maintaining the heated bonding tool in a fixed position.

13 Claims, 4 Drawing Sheets

METHOD AND APPARATUS FOR CIRCUIT BOARD SUPPORT DURING COMPONENT MOUNTING

BACKGROUND OF THE INVENTION

1. Field of the Invention

The present invention relates in general to the field of integrated circuit device mounting techniques and in particular to methods and apparatus for supporting a circuit board from one side while a component is mounted to the second side. Still more particularly the present invention relates to methods and apparatus for supporting a circuit board during mounting of an electronic component which will accommodate misalignment between the circuit board and the support fixture.

2. Description on the Prior Art

The increasing complexity of electronic systems and the concomitant increase in component density has resulted in the common utilization of robotic systems for the manufacturing of such systems. Those skilled in the art will appreciate that robotic systems provide a high degree of efficiency and speed for repetitive operations, such as the mounting of integrated circuit devices to circuit boards.

Many techniques exist for the mounting of electronic components to circuit boards. One such technique is the so-called "hot bar thermode" bonding technique which utilizes a placement head to position an integrated circuit having a plurality of conductive leads at a desired mounting point on a printed circuit board. Thereafter, multiple heat activatable blades are urged into contact with the conductive leads and heated to a point where the electronic component is bonded to the circuit board by means of presoldered connections thereon. Such hot bar thermode bonding requires back-side support of the circuit board or substrate which is capable of withstanding substantial forces. Typically, a force of up to 200 Newtons may be applied during the heating of the thermode blades in order to generate the required heat transfer necessary to melt the solder at the connections.

In known prior art systems a support anvil is typically provided and generally comprises a rigid fixture with a rubber gasket. The rubber gasket was assumed to deliver an even force to the back side of the bond area but it has recently been discovered that where misalignment occurs between the thermode blade and the back side support a significant variation in the force levels along the thermode blade may be generated. This condition is undesirable in that it results in an unreliable mounting of an electronic component.

Additionally, such hot bar thermode bonding tools are typically quite complex in that the heat activatable thermode blades are often resiliently mounted to accommodate such misalignments and the placement head must be capable of accurate positioning of an electronic component while exerting the large forces necessary to accomplish bonding.

It should therefore be apparent that a need exists for an improved method and apparatus for supporting a circuit board during the mounting of an electronic component which will accommodate variations in planarity between the support fixture, the circuit board and the bonding tool. Further, such an improved system should be able to accommodate the presence of electronic components on both sides of a circuit board which can further complicate any attempt at providing support during the mounting of an electronic component.

SUMMARY OF THE INVENTION

It is therefore one object of the present invention to provide an improved method and apparatus for mounting integrated circuit devices.

It is yet another object of the present invention to provide an improved method and apparatus for mounting integrated circuit devices which permits the supporting of a circuit board from one side while a component is mounted to the second side.

It is yet another object of the present invention to provide an improved method and apparatus for supporting a circuit board during the mounting of an electronic component which will accommodate misalignment between the support fixture, the circuit board and the bonding tool.

The foregoing objects are achieved as is now described. The method and apparatus of the present invention may be utilized to support a selected mounting point on a circuit board during the mounting an electronic component. An integrated circuit device is selected and positioned adjacent a first side of a circuit board at a desired mounting point, utilizing a robotic manipulator and a placement head. A support fixture is then urged into temporary contact with a second side of the circuit board utilizing a flexible mounting system such that minor variations or misalignments between the plane of the support fixture, the circuit board and the placement head are eliminated during operation of a heated bonding tool. A compliant layer mounted to the support fixture may be utilized to accommodate surface irregularities on the circuit board. In one embodiment of the present invention a flexible fluid filled bag is utilized in conjunction with the support fixture so that the presence of components on the second side of the circuit board may be accommodated while supporting the circuit board during component mounting. In order to fully support the mounting of rectangular electronic components in multiple orientations the support fixture may be selectively rotated. Finally, the requirement for providing a robotic manipulator and placement head capable of generating the substantial downward forces necessary to create a bond between a circuit board and an electronic component is eliminated by positioning the placement head and heated bonding tool proximate to the conductive leads of an electronic component and then forcefully urging the support fixture upward while maintaining the heated bonding tool in a fixed position.

The above as well as additional objects, features, and advantages of the invention will become apparent in the following detailed description.

BRIEF DESCRIPTION OF THE DRAWING

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
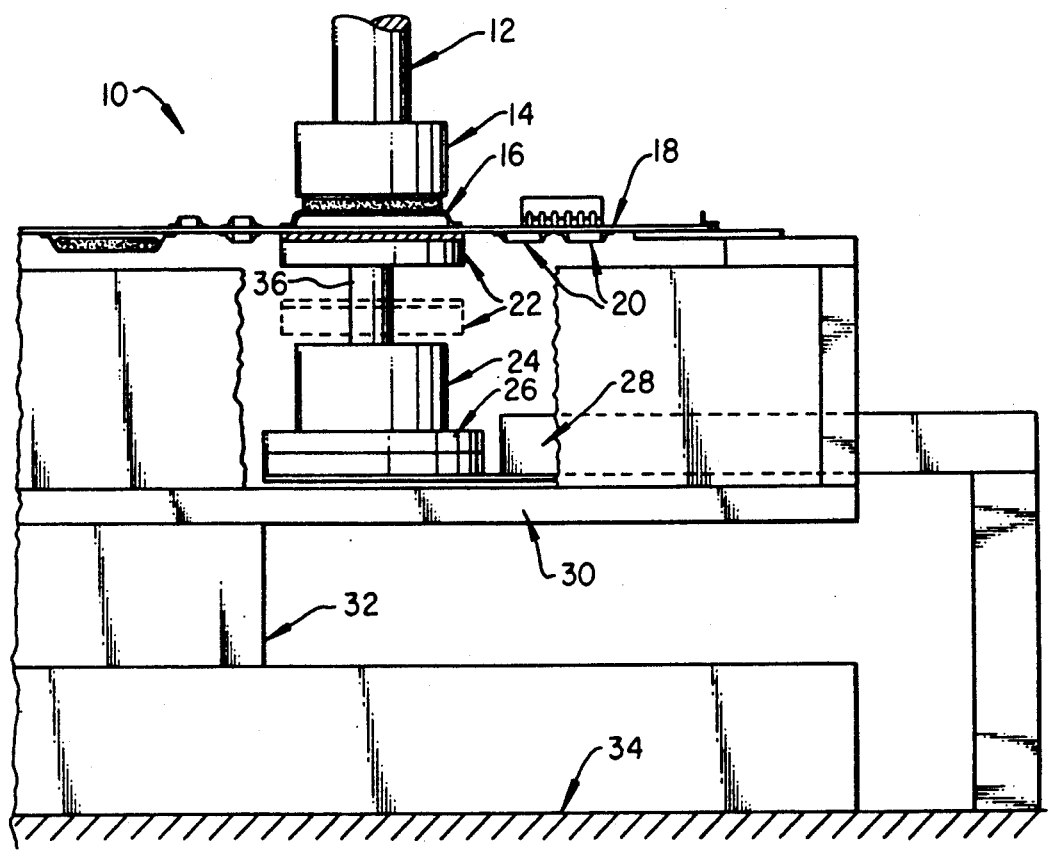
FIG. 1 is a partially cut-away view of the circuit board support apparatus of the present invention.

With reference now to the figures and in particular with reference to FIG. 1, there is depicted a partially cut-away view of component placement system 10 of the present invention. As is illustrated, component placement system 10 includes a manipulator arm 12 which is connected, in a manner well known in the art, to a robotic system which permits an electronic component to be picked up and manipulated with great exactitude to a desired mounting point on a circuit board. Mounted to the end of manipulator arm 12 is placement head 14. Placement head 14 preferably includes a heated bonding tool, such as a hot bar thermode, which may be utilized to bond an electronic component 16 to circuit board 18 by heating presoldered connection points which are disposed on circuit board 18.

Also depicted within FIG. 1 are various back side components 20 which, in accordance with the high density manufacturing techniques utilized in modern state-of-the-art electronic systems may be mounted on both sides of the circuit board 18.

Still referring to FIG. 1, a support fixture 22 is illustrated which may be selectively and temporarily urged into contact with circuit board 18, by means of actuator 36. Actuator 36 is preferably controlled by pneumatic cylinder 24. Support fixture 22 may be raised and lowered, as depicted in FIG. 1, to permit circuit board 18 to be moved about in the plane in which circuit board 18 is mounted, without the possibility of back side components 20 being disturbed by support fixture 22.

In accordance with an important feature of the present invention pneumatic cylinder 24 is preferably mounted on rotary activator 26. Rotary activator 26 may be utilized to selectively rotate support fixture 22 such that support fixture 22 may be arranged to accurately underlie a rectangular electronic component which is mounted in any desired orientation on the surface of circuit board 18. Thus, a uniform force of support may be exerted upon a rectangular electronic component 16 by rotating support fixture 22, by means of rotary activator 26, greatly enhancing the effectiveness of component placement system 10. Of course, those skilled in the art will appreciate that the raising and lowering of support fixture 22 by means of actuator 36 and the rotation thereof by means of rotary activator 26 may be simply and easily controlled by means of computer circuitry, in a manner well known in the computer aided manufacturing art.

Pneumatic cylinder 24 is, in the depicted embodiment of the present invention, mounted within circuit board holder frame 30 by means of cantilever mounting beam 28. A small amount of space is preferably provided between the lower surface of the mounting plate of pneumatic cylinder 24 and the lower member of circuit board holder frame 30, such that additional compliance may be obtained during the provision of those forces necessary to mount component 16 to circuit board 18.

In the depicted embodiment of the present invention circuit board holder frame 30 is shown mounted to a conventional X-Y table 32, which is mounted to machine base 34 in a manner well known in the art. Those skilled in the art will appreciate that different forms of X-Y table 32 may be provided. For example, a so-called "open frame" X-Y table may be provided which includes an aperture in the surface thereof within which circuit board 18 may be mounted and manipulated in an X-Y plane. This type of system will obviate the necessity of providing cantilever mounting beam 28 since support fixture 22 may be simply and fixedly mounted beneath the aperture in such a device. However, it is the experience of the Applicants that a solid frame X-Y table, such as X-Y table 32, provides a greater accuracy and thus it is necessary to mount pneumatic cylinder 24 on cantilever mounting beam 28 which extends into circuit board holder frame 30 in the manner depicted.

Upon reference to the foregoing those skilled in the art will appreciate that component 16 may be picked up at a location not illustrated and moved via manipulator arm 12 to a desired mounting point on circuit board 18. Thereafter, manipulator arm 12 is moved in the Z-axis until component 16 comes into contact with circuit board 18 and at that point a Z-axis brake is applied, holding component 16 is in place. Thereafter, support fixture 22 is raised, via actuator 36 of pneumatic cylinder 24, and sufficient pressure is brought to bear on component 16 while heating the presoldered connections adjacent thereto in order to bond component 16 to circuit board 18 in a highly reliable and efficient manner.

Figure 2:
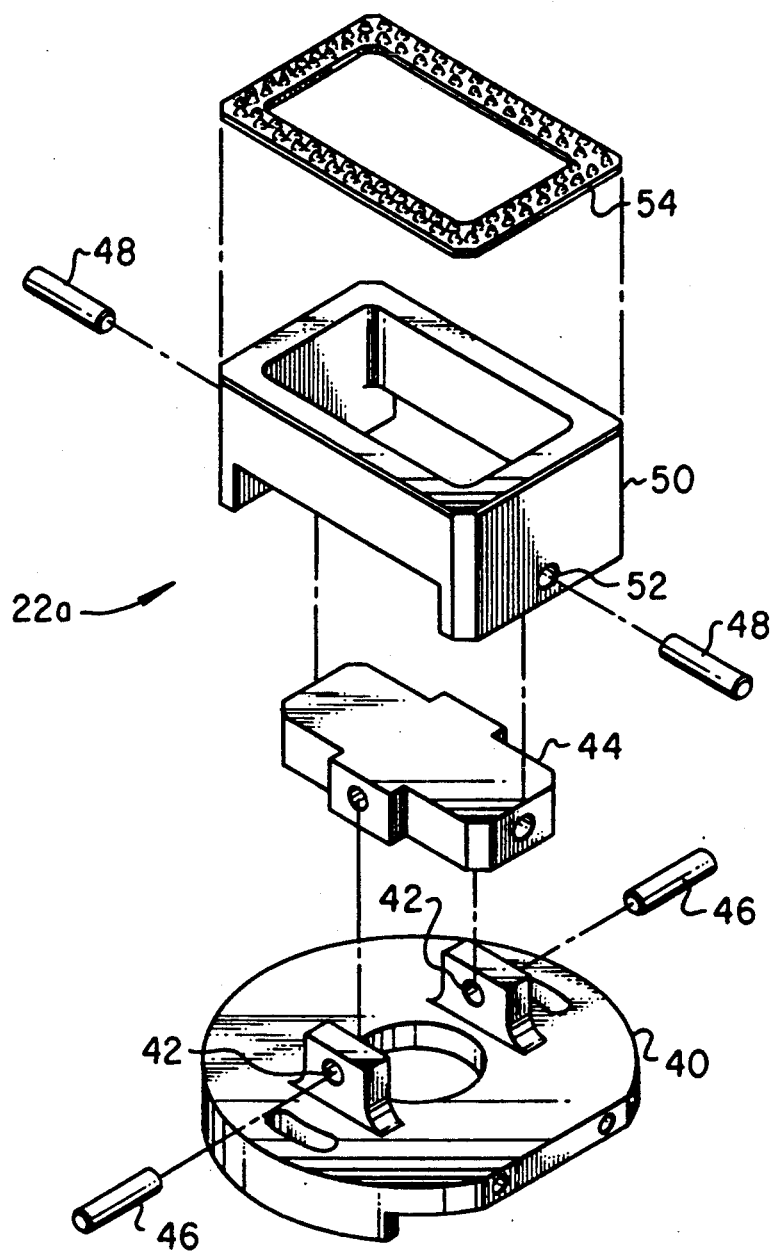
FIG. 2 is an exploded view of one embodiment of a support fixture which may be utilized with the method and apparatus of the present invention.

Referring now to FIG. 2, there is depicted an exploded view of one embodiment of a support fixture which may be utilized to implement support fixture 22 of FIG. 1. As illustrated in FIG. 2, support fixture 22a includes an anvil base plate 40, which is preferably mounted to actuator 36 of FIG. 1. Present within anvil base plate 40 are mounting apertures 42 which are utilized to received pivot pins 46 which serve to mount universal joint 44.

Universal joint 44 preferably is mounted utilizing a second pair of pivot pins 48 which are adapted to be inserted into mounting apertures 52 of rigid rectangular support 50. Rigid rectangular support 50 is preferably sized to approximate the outline of an electronic component, so that the bonding force applied may be equally distributed around the periphery thereof.

Those skilled in the art will appreciate that the provision of universal joint 44, along with its associated pivot pins and mounting apertures will permit rigid rectangular support 50 to rotate freely in two axes. In this manner, slight variations in the planarity of rigid rectangular support 50, circuit board 18 and placement head 14 may be easily and simply accommodated.

Further, a compliant ring 54 is preferably mounted to the upper surface of rigid rectangular support 50 in order to accommodate various surface irregularities which may exist on the lower surface of circuit board 18. In this manner, Variations in gross planarity between rigid rectangular support 50 and circuit board 18 are accommodated by the pivoting nature of the mounting system of rigid rectangular support 50, while slight surface irregularities are accommodated by the compliant nature of compliant ring 54.

In a preferred embodiment of the present invention, compliant ring 54 is preferably implemented utilizing an elastomer such as neoprene. Improved compliance is achieved if the horizontal surface of compliant ring 54 is made discontinuous, as an array of columns for example, lowering the shape factor of compliant ring 54. Shape factor is defined as the ratio of the top surface area to the lateral surface area of a compliant object.

Figure 3:
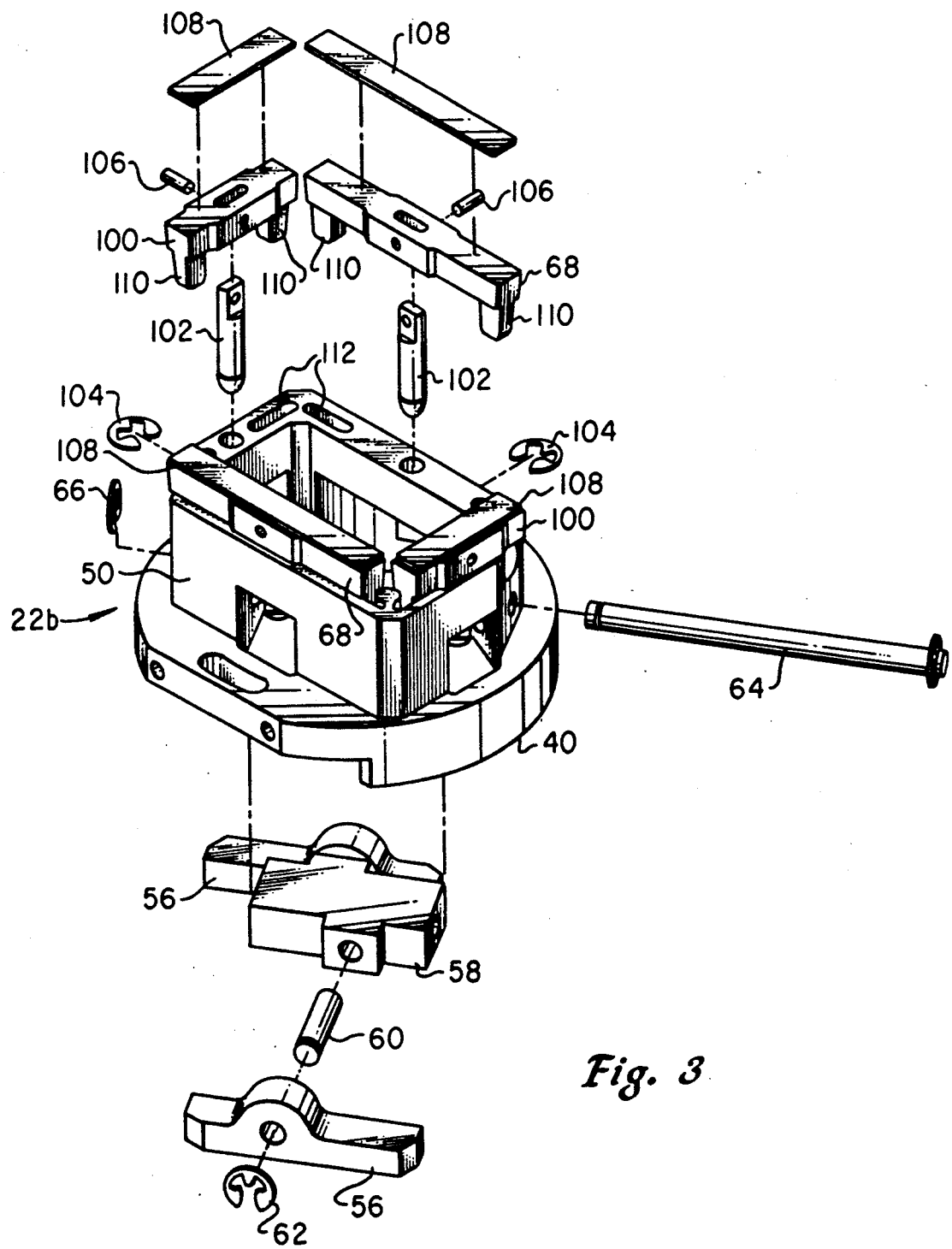
FIG. 3 is an exploded view of a second embodiment of a support fixture which may be utilized with the method and apparatus of the present invention.

With reference now to FIG. 3, there is depicted an exploded view of a second embodiment of a support fixture which may be utilized with the method and apparatus of the present invention. As is illustrated, support fixture 22b includes an anvil base plate 40 similar to that depicted in FIG. 2, which is preferably mounted to actuator 36 of FIG. 1. Mounted to anvil base plate 40 is a rectangular support 50 which is preferably sized to approximate the outline of an electronic component, as disclosed in the embodiment depicted in FIG. 2, so that the bonding force applied may be equally distributed around the periphery of the electronic component.

Mounted within rectangular support 50 is an offset universal joint 58 which is utilized to provide a constant force per linear dimension to the periphery of an electronic component in a manner which will be explained in greater detail below. Mounted to either side of offset universal joint 58, by means of mounting pins 60, are rocker arms 56. Rocker arms 56 are preferably held in place on mounting pins 60 by means of a circlip 62. As illustrated, each rocker arm 56 includes a decentralized pivot point so that a short rocker arm and long rocker arm structure are provided.

Offset universal joint 58 is then mounted within rectangular support 50 by means of pivot pin 64 and circlip 66. In this manner, offset universal joint 58 is permitted to pivot about pivot pin 64 along its longitudinal axis.

Mounted to the upper surface of rectangular support 50 are two pairs of parallel beams 68 and 100. As is illustrated, each parallel beam is mounted to a pivot pin 102 which passes through an aperture in rectangular support 50 and which is secured in place by means of circlips 104. The lower point of each pivot pin 102 then rests upon one of the upper surfaces of each rocker arm 56. In the embodiment depicted in FIG. 3, each pivot pin 102 for parallel beams 100 rests upon the longer arm of an associated rocker arm 56 while each pivot pin 102 associated with parallel beams 68 rests upon the shorter arm of rocker arm 56. In this manner, when equilibrium is achieved a greater pressure is exerted upwardly onto parallel beams 68 due to the off center rotation point of each rocker arm 56. By exerting a greater pressure on each of the longer pair of parallel beams the force per linear dimension for parallel beams 68 and 100 may be effectively equalized. As illustrated, parallel beams 68 and 100 are fixed to the upper surface of pivot pin 102 by means of mounting pins 106.

As is illustrated in FIG. 3, each parallel beam 68 or 100 also includes a plurality of alignment pins 110 which are mounted within apertures 112 of rectangular support 50 to maintain the parallel relationship of parallel beams 68 and parallel beams 100. Further, a compliant strip 108 is preferably mounted to the upper surface of each parallel beam 68 or 100 to compensate for slight surface irregularities, as discussed above. In a manner similar to the surface of compliant ring 54 each compliant strip 108 may achieve improved compliance by having a discontinuous upper surface to enhance the shape factor thereof, as illustrated above.

It should therefore be apparent that support fixture 22b provides a method whereby a consistent force may be applied to a mounting point adapted for utilization with a rectangular component. By providing an off center rotational point for each rocker arm 56 a force may be provided along the long side of a rectangular component which is proportionally larger than the force applied to the short side of the rectangular component so that a constant force per linear dimension is provided, further enhancing the equal distribution of bonding force during the mounting of a rectangular component.

Figure 4A:
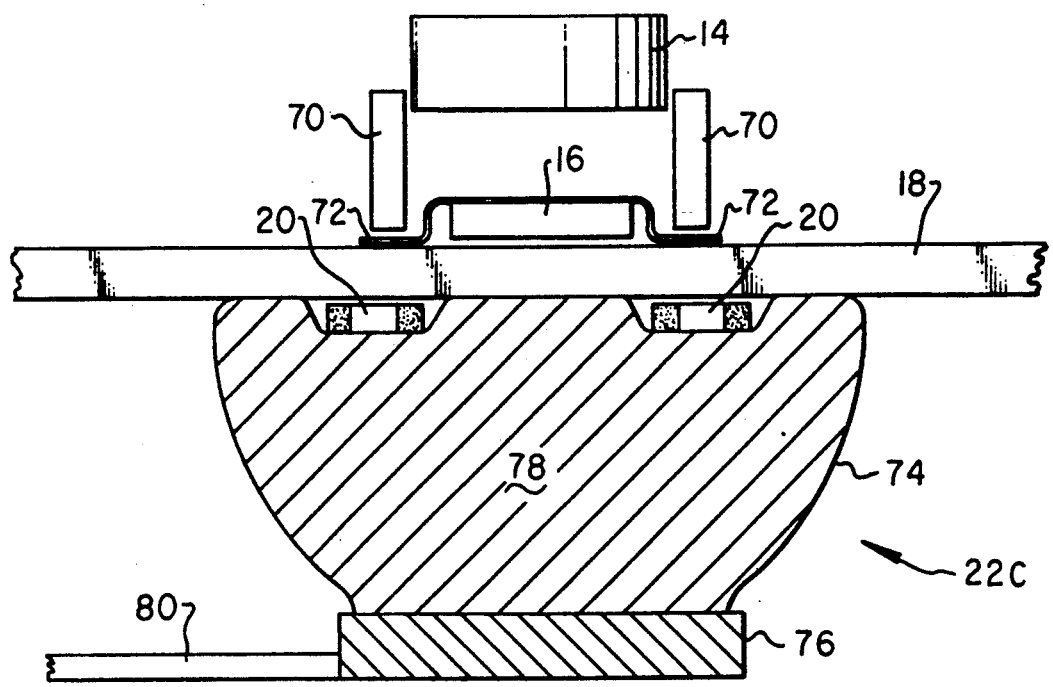
FIGS. 4a and 4b depict sectional views of two variations of a third embodiment of a support fixture which may be utilized with the method and apparatus of the present invention.
Figure 4B:
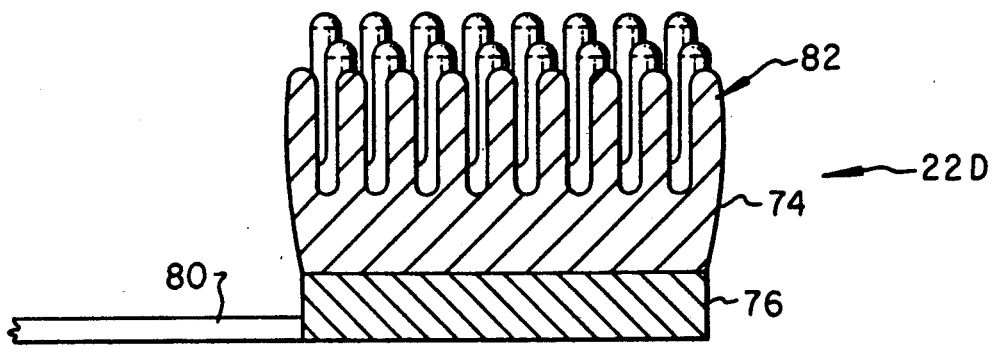

Referring now to FIG. 4a and 4b, there are depicted section views of two variations of a third embodiment of a support fixture which may be utilized with the method and apparatus of the present invention. As is illustrated in FIG. 4a support fixture 22c preferably comprises a flexible fluid filled bag 74 which is filled with fluid 78. Fluid 78 preferably comprises ethylene glycol a fluid which is selected for appropriate heat dissipation and other characteristics. As illustrated within FIG. 4a flexible fluid filled bag 74 may be urged upward into contact with the lower surface of circuit board 18, despite the presence of back side components 20. In this manner an equally distributed support force may be provided during the bonding of component 16 within placement head 14. Such bonding typically is accomplished by the utilization of heat activatable thermode blades 70. By urging heat activatable thermode blades 70 into contact with conductive leads 72 of component 16, while providing an evenly distributed pressure to the lower side of circuit board 18 by means of flexible fluid filled bag 74, component 16 may be efficiently and accurately bonded to circuit board 18, despite the presence of back side components 20 which might otherwise render the support of circuit board 18 difficult to accomplish.

As is illustrated, flexible fluid filled bag 74 is preferably mounted to a base plate 76 which will be attached to actuator 36 (not shown). A fill tube 80 is also provided and it utilized to increase or decrease the amount of fluid present within flexible fluid filled bag 74, to permit minor variations in the amount of pressure to be exerted on the lower side of circuit board 18.

Referring now to FIG. 4b there is depicted a second variation of support fixture 22d which may be utilized with the method and apparatus of the present invention. In the embodiment depicted within FIG. 4b flexible fluid filled bag 74 includes a plurality of flexible fingers 82. This technique may also be utilized to provide an evenly distributed support force to the lower surface of circuit board 18 while accommodating the presence of various backside components 20. As above, flexible fluid filled bag 74 is preferably mounted to base plate 76 and includes a fill tube 80 for increasing or decreasing the amount of fluid within flexible fluid filled bag 74. In the embodiment depicted in FIGS. 4a or 4b flexible fluid filled bag 74 may preferably be provided utilizing any resilient flexible material capable of withstanding the pressures and temperatures encountered during component bonding.

Figure 5:
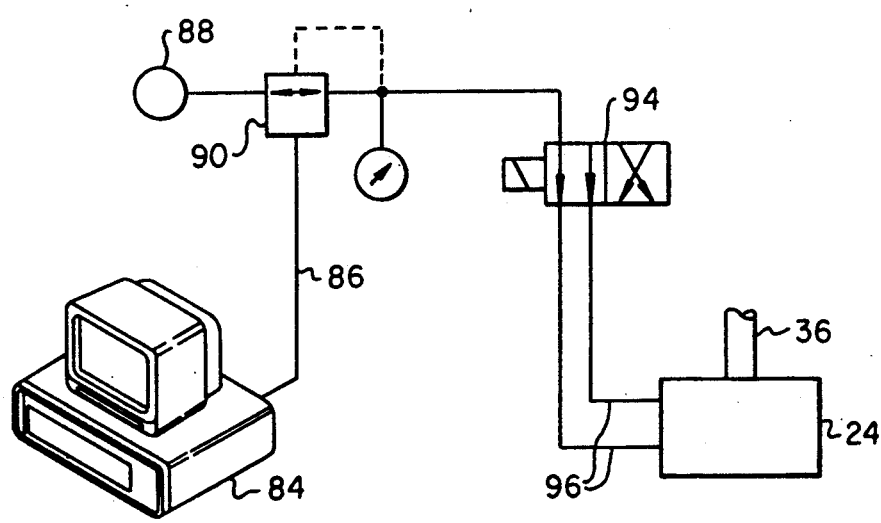
FIG. 5 is a schematic representation of a variable force support fixture which may be utilized with the method and apparatus of the present invention.

Finally, with reference to FIG. 5, there is depicted a schematic representation of a variable force support fixture which may be utilized with the method and apparatus of the present invention. In prior art electronic component bonding machines, the amount of force applied to an electronic component during placement and mounting is typically generated by a robotic arm, such as manipulator arm 12. A support anvil or fixture is typically mounted to a pneumatic cylinder and urged against the lower surface of circuit board 18 by a specified force which is determined by regulating the amount of pressure applied to the pneumatic cylinder.

While this technique works satisfactorily, the necessity of creating a manipulator arm and placement head which are capable of the fine manipulation of an electronic component which is necessary in order to achieve the accuracy in placement which is desired for modern electronic systems while simultaneously generating the large amounts of force necessary to ensure proper thermal conductivity during bonding, has resulted in an increasingly complex and expensive system.

In contrast, one embodiment of the method and apparatus of the present invention utilizes a technique wherein manipulator arm 12 is utilized to position placement head 14 and component 16 in proximity to a desired mounting position on circuit board 18 (see FIG. 1). thereafter, placement head 14 is held rigid in a fixed position. A support fixture of one of the types illustrated herein is then urged upward into contact with the lower surface of circuit board 18, by means of actuator 36, and a precisely regulated amount of pressure is exerted, urging circuit board 18 into contact with the conductive leads of component 16. At this time the heat activatable bonding blades of placement head 14 are actuated. By generating all of the bonding force necessary to achieve an accurate electronic bonding of component 16 to circuit board 18 by means of a support fixture below the circuit board the increased complexity necessary in prior art systems is greatly reduced.

The system depicted in FIG. 5 illustrates one technique whereby this may be accomplished. A computer or other suitable programmable device 84 is preferably utilized to select a desired amount of pressure which will be exerted on the lower surface of circuit board 18. This pressure is preferably expressed as a multibit digital signal. The depicted embodiment of the present invention utilizes an 8 bit signal which is coupled to regulator 90 by means of control cable 86. Regulator 90 is preferably a regulator having a controllable output pressure which corresponds closely to an input signal received from computer 84. Regulator 90 is preferably implemented utilizing a Proportionair BB1MFD, which will output one of 256 different pressure levels in response to an 8 bit digital input.

By providing an air supply 88 which is capable of generating pressurized air at 100 pounds per square inch, 256 different pressures may be output from regulator 90, resulting in a highly accurate regulation of the amount of force which is exerted by actuator 36 on a support fixture. The output of regulator 90 is preferably coupled to pneumatic cylinder control valve 94 which regulates the pressure coupled to and from pneumatic cylinder 24.

In this manner a component may be selectively bonded to the upper surface of circuit board 18 by placing that component in proximity to a plurality of presoldered connectors and actuating a heated bonding blade which is held in a fixed position adjacent to the conductive leads. Thereafter, a precise amount of pressure may be exerted on a support fixture located beneath circuit board 18, to generate the exact amount of pressure necessary for proper thermal conductivity and an accurate bond will result. In this manner, the design of manipulator arm 12 and placement head 14 (see FIG. 1) are greatly simplified due to the fact that the ability to provide large downward forces is eliminated.

With the method and apparatus of the present invention, the only requirement levied upon manipulator arm 12 and placement head 14 is the ability to lock the manipulator arm in place in the Z-axis during exertion of large forces during bonding. This may be simply and easily accomplished utilizing the brake mechanism which is commonly employed in such devices to prevent manipulator arm 12 from falling onto circuit board 18 when power is removed from manipulator arm 12. These braking devices are commonly under program control of the robotic system and may be simply activated to resist the large forces applied during bonding in order to protect the precision motors of manipulator arm 12.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. An apparatus for supporting a circuit board during the mounting of an electronic component on a surface thereof, said apparatus comprising:

component mounting means disposed proximate to a first side of a circuit board at a selected mounting point said component mounting means including a plurality of heat activatable blades for bonding an electronic component;

first means for urging said component mounting means into temporary contact with said selected mounting point to mount an electronic component thereat;

a support fixture disposed proximate to a second side of said circuit board at said selected mounting point;

second means for selectively and temporarily urging said support fixture into contact with said selected mounting point in response to a mounting of an electronic component thereat; and flexible mounting means for coupling said support fixture to said second means wherein planar misalignment between said support fixture and said circuit board may be substantially eliminated.

2. The apparatus for supporting a circuit board during the mounting of an electronic component on a surface thereof according to claim 1 wherein said first means comprises a robotic manipulator.

3. The apparatus for supporting a circuit board during the mounting of an electronic component on a surface thereof according to claim 1 wherein said support fixture comprises a rigid rectangular support having a compliant layer disposed thereon.

4. The apparatus for supporting a circuit board during the mounting of an electronic component on a surface thereof according to claim 3 wherein said compliant layer comprises a layer of elastomer mounted to said rigid rectangular support.

5. The apparatus for supporting a circuit board during the mounting of an electronic component on a surface thereof according to claim 3 wherein said flexible mounting means comprises a universal joint having a plurality of pivot pins disposed thereon adapted to be inserted into a plurality of mounting apertures within said rigid rectangular support wherein said rigid rectangular support may pivot in at least two axes.

6. The apparatus for supporting a circuit board during the mounting of an electronic component on a surface thereof according to claim 3 further including means for selectively rotating said rigid rectangular support in a plane parallel to said circuit board wherein electronic component mounting may be supported in multiple orientations.

7. The apparatus for supporting a circuit board during the mounting of an electronic component on a surface thereof according to claim 1 wherein said support fixture comprises a main support beam and at least two parallel beams pivotably mounted thereon.

8. The apparatus for supporting a circuit board during the mounting of an electronic component on a surface thereof according to claim 7 further including a plurality of compliant load spreaders mounted to said at least two parallel beams.

9. The apparatus for supporting a circuit board during the mounting of an electronic component on a surface thereof according to claim 7 wherein said flexible mounting means comprises means for pivotably mounting said main support beam to said second means.

10. An apparatus for supporting a circuit board during the mounting of an electronic component on a first side thereof, said circuit board having at least one electronic component mounted to a second side thereof, side apparatus comprising:

component mounting means disposed proximate to a first side of a circuit board at a selected mounting point;

first means for urging said component mounting means into temporary contact with said selected mounting point to mount an electronic component thereat;

a support fixture having a flexible fluid filled bag mounted thereon disposed proximate to a second side of said circuit board at said selected mounting point; and second means for selectively and temporarily urging said flexible fluid filled bag into contact with said second side of said circuit board and said at least one electronic component in response to a mounting of an electronic component thereat.

11. The apparatus for supporting a circuit board during the mounting of an electronic component on a first side thereof according to claim 10 wherein said flexible fluid filled bag is generally spherical in shape.

12. The apparatus for supporting a circuit board during the mounting of an electronic component on a first side thereof according to claim 10 wherein said flexible fluid filled bag includes a plurality of flexible fingers disposed to contact said second side of said circuit board.

13. The apparatus for supporting a circuit board during the mounting of an electronic component on a first side thereof according to claim 10 further including means for supplying additional fluid to said flexible fluid filled bag.

* * * * *